US012739582B2

(12) United States Patent
Wickham et al.

(10) Patent No.: US 12,739,582 B2
(45) Date of Patent: Sep. 15, 2026

(54) NON-PLANAR DIAMOND BODY FOR A SPEAKER DOME

(71) Applicant: ELEMENT SIX TECHNOLOGIES LIMITED, Didcot (GB)

(72) Inventors: Benjamin Wickham, Didcot (GB); John Robert Brandon, Didcot (GB); Firooz Nasser-Faili, Santa Clara, CA (US); Dermot Francis O'Malley, Didcot (GB)

(73) Assignee: ELEMENT SIX TECHNOLOGIES LIMITED, Didcot (GB)

( * ) Notice: Subject to any disclaimer, the term of this patent is extended or adjusted under 35 U.S.C. 154(b) by 513 days.

(21) Appl. No.: 17/595,646

(22) PCT Filed: Jul. 13, 2020

(86) PCT No.: PCT/EP2020/069781
§ 371 (c)(1),
(2) Date: Nov. 19, 2021

(87) PCT Pub. No.: WO2021/009133
PCT Pub. Date: Jan. 21, 2021

(65) Prior Publication Data

US 2022/0225043 A1 Jul. 14, 2022

Related U.S. Application Data

(60) Provisional application No. 62/873,366, filed on Jul. 12, 2019.

(30) Foreign Application Priority Data

Aug. 2, 2019 (GB) ..................................... 1911086

(51) Int. Cl.

| | |
|---|---|
| ***H04R 31/00*** | (2006.01) |
| ***C23C 16/01*** | (2006.01) |
| ***H04R 7/12*** | (2006.01) |

(52) U.S. Cl.
CPC ........... *H04R 31/003* (2013.01); *C23C 16/01* (2013.01); *H04R 7/127* (2013.01); *H04R 2207/021* (2013.01); *H04R 2307/023* (2013.01)

(58) Field of Classification Search
CPC .. H04R 9/06; H04R 31/003; H04R 2307/023; H04R 31/00; C23C 16/01
See application file for complete search history.

(56) References Cited

U.S. PATENT DOCUMENTS 3,046,362 A 7/1962 White
4,987,002 A * 1/1991 Sakamoto ............ H04R 31/003 427/446

(Continued)

FOREIGN PATENT DOCUMENTS

EP 0341589 A2 11/1989
EP 1207719 A2 5/2002

(Continued)

OTHER PUBLICATIONS

GB1911086.5, "Combined Search and Examination Report", Jan. 28, 2020, 7 pages.

(Continued)

*Primary Examiner* — Jeremy A Luks
(74) *Attorney, Agent, or Firm* — Kilpatrick Townsend & Stockton LLP

(57) ABSTRACT

A non-planar body (1) comprising a dome body (2) having an apex (3) and an outer periphery, the apex (3) located on a first plane (4) and the outer periphery located on a second plane (6) substantially parallel to the first plane (4). A peripheral body (5) extends at least partially around the (Continued)

outer periphery of the dome body (2), and at an angle (7) of less than 180° with respect to a tangent (8) relative to the dome body (2) at the outer periphery of the dome body (2), the angle (7) being measured at an outer surface of the dome body (2). Any of the dome body (2) and the peripheral body are formed from polycrystalline diamond.

16 Claims, 7 Drawing Sheets

(56) References Cited

U.S. PATENT DOCUMENTS

| | | | | |
|---|---|---|---|---|
| 5,114,745 | A * | 5/1992 | Jones | C23C 16/01 427/249.7 |
| 5,556,464 | A | 9/1996 | Tanabe et al. | |
| 5,744,761 | A * | 4/1998 | Ogura | H04R 31/003 181/170 |
| 6,248,400 | B1 | 6/2001 | Kurihara et al. | |
| 7,463,749 | B2 * | 12/2008 | Lee | H04R 7/18 381/423 |
| 7,878,297 | B2 * | 2/2011 | Baker | H04R 7/127 29/609.1 |
| 8,774,447 | B2 * | 7/2014 | Ko | H04R 9/06 381/396 |
| 10,244,322 | B2 * | 3/2019 | Geva | H04R 7/26 |
| 10,587,950 | B2 * | 3/2020 | Huwe | H04R 1/26 |
| 2002/0118857 | A1 | 8/2002 | Ohashi et al. | |
| 2003/0108476 | A1 | 6/2003 | Woerner et al. | |
| 2006/0088184 | A1 | 4/2006 | Ohashi et al. | |
| 2009/0022951 | A1 | 1/2009 | Nelissen et al. | |

FOREIGN PATENT DOCUMENTS

| | | | |
|---|---|---|---|
| EP | 1694092 | A1 | 8/2006 |
| EP | 3182725 | A1 | 6/2017 |
| GB | 2113041 | A | 7/1983 |
| GB | 2413234 | A | 10/2005 |
| GB | 2429367 | A | 2/2007 |
| GB | 2488029 | A | 8/2012 |
| GB | 2504380 | A | 1/2014 |
| GB | 2547302 | A | 8/2017 |
| JP | 5280021 | A | 7/1977 |
| JP | 62152299 | | 7/1987 |
| JP | 0385099 | | 4/1991 |
| JP | 2008085985 | A | 4/2008 |
| WO | 2005101900 | A1 | 10/2005 |
| WO | 2012110357 | A1 | 8/2012 |
| WO | 2013178535 | A2 | 12/2013 |

OTHER PUBLICATIONS

GB2010747.0, "Combined Search and Examination Report", Dec. 14, 2020, 7 pages.

PCT/EP2020/069781, "International Search Report and Written Opinion", Oct. 2, 2020, 16 pages.

* cited by examiner

NON-PLANAR DIAMOND BODY FOR A SPEAKER DOME

FIELD

The invention relates to the field of non-planar diamond bodies, and in particular, non-planar bodies made at least partially from polycrystalline diamond.

BACKGROUND

Diamonds have long been used in jewellery due to their long life and aesthetic appeal. Diamond materials also have a range of desirable properties for a large number of different technical applications. For example, the high thermal conductivity of diamond makes it suitable for heat spreading applications. The optical properties of diamond make it suitable for many optical applications. The hardness of diamond makes it good in abrasive applications. The stiffness of diamond makes it suitable for applications such as speaker domes. Such speaker domes can form high frequency tweeters with a very high break-up frequency beyond the human audio range in order to produce a very high quality sound in the human audio range. Non-planar diamond bodies can be used in applications including but not limited to speaker domes, microphone diaphragms and optical elements.

WO2005/101900 discloses such a diamond speaker dome. As described in WO2005/101900, harmonics can extend below the fundamental break-up frequency so it is desirable for the break-up frequency to be well removed from the end of the human audio range to ensure that sound reproduction is not impaired by flexing of the speaker dome at high frequency oscillation. WO2005/101900 describes that a speaker dome having a high break-up frequency can be provided by a synthetic diamond speaker dome having an integral peripheral skirt of specific dimensions. No details of the specific manufacturing method for fabricating such a speaker dome are recited in the document.

In some applications, such as speakers for headphones, a separate tweeter is not used and a single diamond speaker must handle a much wider range of frequencies than a tweeter would be expected to handle; this includes frequencies in the bass, mid-range and high ranges. GB2429367 discloses a diamond diaphragm that has variable thickness, hardness and damping characteristics in order to cover a wider range of frequencies.

SUMMARY

For certain applications of a non-planar diamond body, it is desirable to improve its performance.

According to a first aspect, there is provided a non-planar body comprising a dome body having an apex and an outer periphery, the apex located on a first plane and the outer periphery located on a second plane substantially parallel to the first plane. A peripheral body is formed extending at least partially around the outer periphery of the dome body. The peripheral body extends at an angle of less than 180° when measured at an outer surface of the dome body and with respect to a tangent relative to the dome body at the outer periphery of the dome body. Any of the dome body and the peripheral body are formed from polycrystalline diamond.

As an option, the peripheral body extends substantially along the second plane.

As an option, the peripheral body extends towards the first plane.

As an option, both the dome body and the peripheral body are integrally formed from polycrystalline diamond.

As an option, the dome body comprises a partial ellipsoidal surface. Alternatively, the dome body comprises a partial spherical surface.

As an option, the peripheral body extends fully around the outer periphery of the dome body.

The peripheral body optionally comprises any of a partial toroidal surface, a frustoconical surface and a substantially cylindrical surface. As a further option, the peripheral body comprises a planar surface attached to the outer periphery of the dome body, the planar surface located substantially on the second plane.

The non-planar body optionally has a largest linear dimension when projected onto a plane selected from any of no less than 10 mm, no less than 20 mm, and no less than 30 mm.

The non-planar body according to claim 8, wherein the largest linear dimension is in a range selected from any of 5 mm to 55 mm, 10 mm to 45 mm, 15 mm to 30 mm, or 25 mm to 35 mm.

As an option, the dome body has a mean thickness selected from any of no more than 500 μm, no more than 400 μm, no more than 300 μm, no more than 200 μm, no more than 100 μm, no more than 75 μm, no more than 50 μm, and no more than 25 μm.

As an option, the minimum thickness of the diamond in the non-planar body is greater than 20% of the maximum thickness of the non-planar body, greater than 30% of the maximum thickness of the non-planar body, greater than 40% of the maximum thickness of the non-planar body, or greater than 50% of the maximum thickness of the non-planar body.

The non-planar body optionally has a mass in a range selected from any of 35 mg to 150 mg, 60 mg to 120 mg, 65 mg to 110 mg, 70 mg to 105 mg, or 70 mg to 100 mg.

As an option, the non-planar body further comprises a secondary peripheral body extending from an outer periphery of the peripheral body.

The non-planar body is optionally circular in plan view, and the ratio of the distance between the first plane and the second plane to the diameter of the non-planar body is selected from any of between 0.05 of 0.30, 0.08 and 0.2 and 0.10 and 0.15.

As an option, the average thickness at the apex of the dome body is greater than the average thickness at the outer periphery of the dome body.

According to a second aspect, there is provided a speaker dome comprising the non-planar body described above in the first aspect. Optionally, during use, a break-up frequency of the speaker dome is selected from any of greater than 10 kHz, 20 kHz, 30 kHz, 40 kHz, 50 kHz, 60 kHz, and 70 kHz.

According to a third aspect, there is provided a method of fabricating the non-planar body described above in the first aspect. The method comprises providing a non-planar substrate, in a reactor, growing a film of polycrystalline diamond on the non-planar substrate, and removing the film of polycrystalline diamond from the substrate to form the non-planar body.

The substrate is optionally formed of silicon, and the step of removing the film of polycrystalline diamond from the substrate comprises dissolving the silicon in acid. Alternatively, the substrate is optionally formed from graphite and the step of removing the film of polycrystalline diamond from the substrate comprises processing the graphite away from the polycrystalline diamond. Alternatively, the substrate is optionally formed from a carbide forming refractory metal substrate and the step of removing the film of polycrystalline diamond from the substrate comprises cooling the carbide forming refractory metal substrate and the film of polycrystalline CVD synthetic diamond material at a controlled rate whereby the film of polycrystalline CVD synthetic diamond material delaminates from a metal carbide surface of the carbide forming refractory metal substrate during cooling.

The reactor is optionally selected from any one of a microwave plasma CVD reactor, a hot filament reactor, and a DC arc jet reactor.

As an option, the non-planar substrate comprises a convex dome shape or a concave dome shape.

As an option, the method comprises growing the dome body and peripheral body integrally in the reactor. Alternatively, the dome body is grown in the reactor, and the method further comprises affixing the peripheral body to the dome body to form a speaker dome. Alternatively, the peripheral body is grown in the reactor, and the method further comprises affixing the dome body to the peripheral body to form a speaker dome.

BRIEF DESCRIPTION OF DRAWINGS

Non-limiting embodiments will now be described by way of example and with reference to the accompanying drawings in which.

DETAILED DESCRIPTION

Figure 1:
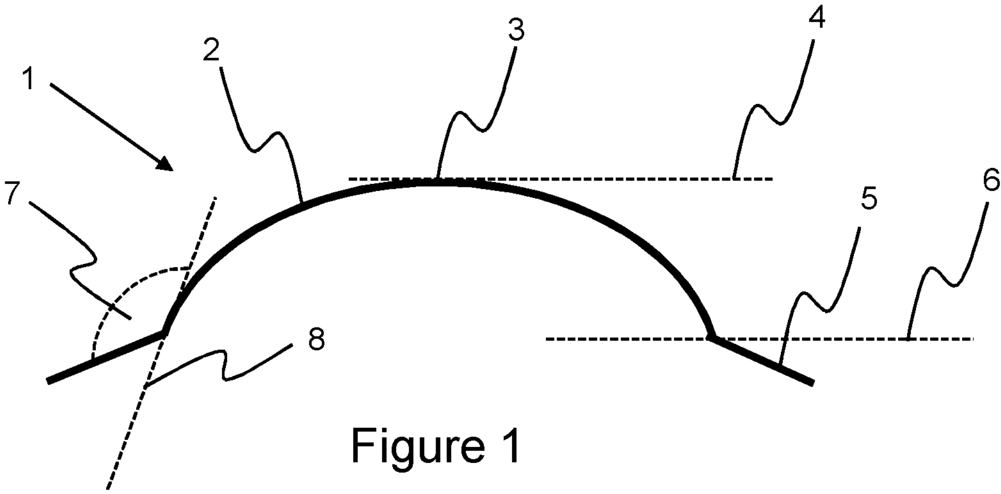
FIG. 1 illustrates schematically a side elevation cross-section view of a first exemplary non-planar body.

The polycrystalline chemical vapour deposition (CVD) synthetic diamond portions of the non-planar body described herein can be grown using a variety of methods including hot filament, microwave plasma, and DC arc jet reactors. Each of these methods has its virtues. DC arc jet deposition systems tend to have highly localized growth rates, but suffer from electrode/nozzle erosion, high gas consumption and relatively poor area coverage. Hot filament reactors can coat large areas and 3D shapes but with limited film thickness and with relatively poor quality of diamond. In contrast, microwave plasma CVD diamond has become established as the leading method for producing high quality, bulk diamond. Unfortunately, microwave plasma methods have only limited capabilities to uniformly coat non-planar substrates due to the interaction of the microwave electric field and the non-planar substrate. Coating of even simple 3D shapes such as tool inserts or loudspeaker dome mandrels is made difficult by the effects of electric field concentrations at external corners or conversely the weakness in electric fields at internal corners. This variation in the electric field adversely affects the uniformity of both quality and thickness of the diamond film. Materials that are thermally sensitive in terms of melting point or thermal shock are even more challenging to coat uniformly in a microwave plasma reactor.

In light of the above, one would expect that a microwave plasma process would not be suitable for implementing embodiments of the present invention. However, it has been found that careful control of microwave plasma CVD apparatus, careful processing of the substrate surface, and careful control of the growth and cooling cycle makes it possible to perform the present invention using a microwave plasma CVD process. Since such a process results in higher quality diamond material when compared with alternative growth methods, it can thus be advantageous to use a microwave plasma CVD reactor in order to fabricate high quality polycrystalline CVD synthetic diamond material. For example, the CVD reactor may be operated at a microwave frequency in a range 800 MHz to 1000 MHz with a pressure of at least 80 Torr, 100 Torr, 120 Torr, 140 Torr, 160 Torr, 180 Torr, 200 Torr, 230 Torr, 260 Torr, or 300 Torr, and/or a microwave power of at least 2 kW, 5 kW, 10 kW, 15 kW, 20 kW, 25 kW, or 30 kW. If high operating powers and pressures are utilized for CVD diamond growth, cooling after growth can be achieved by reduction of power and pressure within the CVD reactor to avoid thermally induced cracking of the polycrystalline CVD synthetic diamond non-planar body. For example, the controlled rate of cooling may comprise reducing the growth temperature down to at least 800° C., 750° C., 700° C., 650° C. or 600° C. or 550° in a controlled ramp down over a time period of at least 10 minutes, 15 minutes, or 20 minutes prior to extinguishing plasma in the CVD reactor.

The process gas may comprise one or more of: a carbon containing gas in a range 1 to 10%, 1 to 7%, 2 to 5%, 2 to 4%, or 2.5 to 3.5% of a total process gas flow rate; an inert gas, such as argon, in a range 0.5 to 10%, 0.5 to 7%, 0.5 to 5%, 0.5 to 3%, or 1.0 to 2.0% of a total process gas flow rate; and hydrogen in a range 85 to 98%, 90 to 98%, 93.0 to 97.5%, 94.0 to 96.5%, or 95.0% to 96% of a total process gas flow rate. The process gas is directed towards the substrate through one or more gas inlet nozzles disposed opposite the substrate within the CVD reactor.

In order to provide the non-planar shape of the body, diamond is deposited on a substrate that provides a predominantly dome-shaped growth surface (either convex or concave). The dome-shaped growth surface has a largest linear dimension when projected onto a plane selected from any of no less than 10 mm, no less than 15 mm, no less than 20 mm, no less than 25 mm and no less than 30 mm.

As described above, it is known to provide speaker domes with a peripheral body that extends down away from the plane on which the apex of the dome is located. The inventors have surprisingly found that improved speaker dome properties can be achieved if a peripheral body is provided that extends towards the plane on which the apex of the dome is located. There are many geometries that can be used to achieve this. FIGS. 1 to 13 give exemplary geometries in which the peripheral body extends towards the plane on which the apex is located. In the examples given for FIGS. 1 to 13, the entire non-planar body is assumed to be formed from polycrystalline diamond. However, as will be explained below, it may be that either the dome body or the peripheral body is formed from a different material.

FIG. 1 is a schematic side elevation view of a first exemplary non-planar body 1. The non-planar body 1 has a dome body 2, which has an apex 3 that is located on a first plane 4. A peripheral body 5 meets the dome body 2 on a second plane 6 at the point where it meets the periphery of the dome body 2. The peripheral body 5 extends at an angle 7 of less than 180° with respect to a tangent 8 relative to the dome body 2 at the outer periphery of the dome body 2, the angle being measured at an outer surface of the dome body 2.

The dome body 2 is ellipsoidal and may have a circular plan view or a substantially elliptical plan view. This is true for all of the embodiments shown in FIGS. 1 to 13. In the example of FIG. 3, the curved portion of the peripheral body 5 has a partial toroidal surface as it extends towards the first plane 4.

Figure 2:
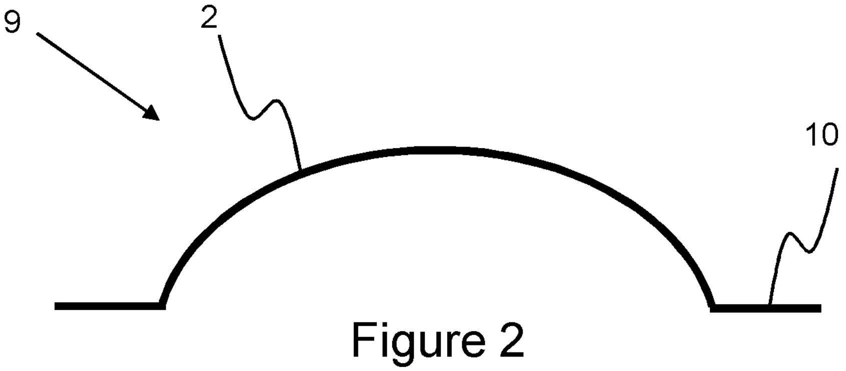
FIG. 2 illustrates schematically a side elevation cross-section view of a second exemplary non-planar body.
Figure 3:
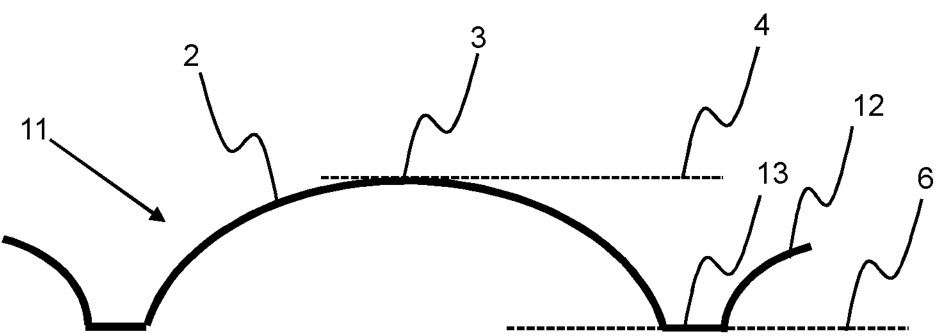
FIG. 3 illustrates schematically a side elevation cross-section view of a third exemplary non-planar body.

FIG. 2 is a schematic side elevation view of a second exemplary non-planar body 9. As with the embodiment of FIG. 1, the non-planar body 9 has a dome body 2, which has an apex 2 that is located on a first plane 4. A peripheral body 10 is located on the second plane 6 at the point where it meets the periphery of the dome body 2 and extends along the second plane 6.

FIG. 3 is a schematic side elevation view of a third exemplary non-planar body 11. The non-planar body 11 has a dome body 2, which has an apex 3 that is located on a first plane 4. A peripheral body 12 is located on the second plane 6 at the point where it meets the periphery of the dome body 2. The peripheral body 12 extends toward the first plane 4 (although note that it does not extend towards the apex 3). Note that a planar section 13 of the peripheral body 12 forms an annulus around the periphery of the dome body 2 before the peripheral body 12 starts to extend towards the first plane 4.

The dome body 2 is ellipsoidal and may have a circular plan view or a substantially elliptical plan view. This is true for all of the embodiments shown in FIGS. 1 to 13. In the example of FIG. 3, the curved portion of the peripheral body 5 has a partial toroidal surface as it extends towards the first plane 4.

Where the non-planar body is used as a speaker dome, the voice coil would typically sit below the planar section 13 of the peripheral body 12, or at the interface between the dome body 2 and the peripheral body 12.

Figure 4:
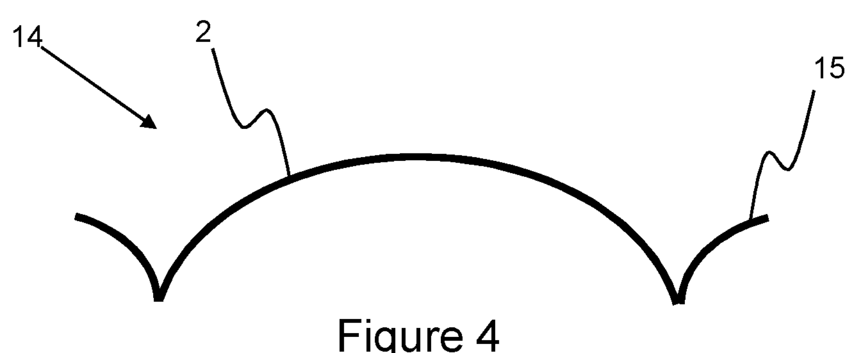
FIG. 4 illustrates schematically a side elevation cross-section view of a fourth exemplary non-planar body.

FIG. 4 is a schematic side elevation view of a fourth exemplary non-planar body 14. As with the embodiment of FIG. 3, the non-planar body 14 has a dome body 2, which has an apex 2 that is located on a first plane 4. A peripheral body 15 is located on the second plane 6 at the point where it meets the periphery of the dome body 2. The peripheral body 15 extends toward the first plane 4. In the fourth exemplary embodiment, the peripheral body 15 does not have a planar section but begins to extend towards the first plane 4 at the point at which it meets the periphery of the dome body 2. The peripheral body 15 has a partial toroidal surface as it extends towards the first plane 4.

Figure 5:
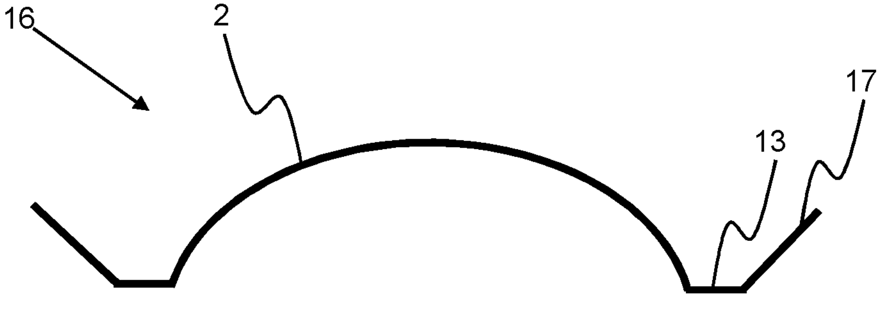
FIG. 5 illustrates schematically a side elevation cross-section view of a fifth exemplary non-planar body.

FIG. 5 is a schematic side elevation view of a fifth exemplary non-planar body 16. The non-planar body 1 has a dome body 2, which has an apex 3 that is located on a first plane 4. A peripheral body 17 is located on a second plane 6 at the point where it meets the periphery of the dome body 2. The peripheral body 17 extends toward the first plane 4. A planar section 13 of the peripheral body 11 forms an annulus around the periphery of the dome body 2 before the peripheral body 17 starts to extend towards the first plane 4. In the example of FIG. 5, the peripheral body 17 comprises a frustoconical surface that extends towards the first plane 4.

Figure 6:
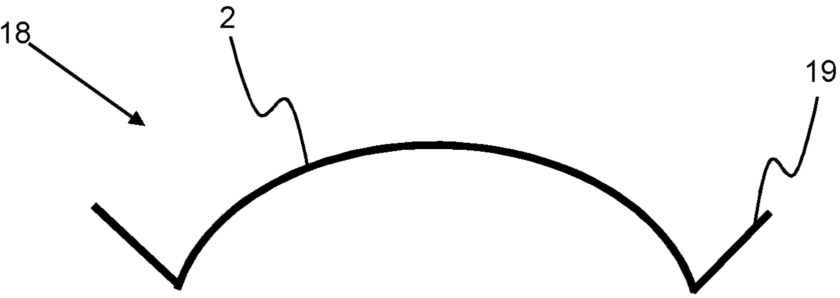
FIG. 6 illustrates schematically a side elevation cross-section view of a sixth exemplary non-planar body.

FIG. 6 is a schematic side elevation view of a sixth exemplary non-planar body 18. As with the embodiment of FIG. 3, the non-planar body 18 has a dome body 2, which has an apex 2 that is located on a first plane 4. A peripheral body 19 is located on a second plane 6 at the point where it meets the periphery of the dome body 2. The peripheral body 19 extends toward the first plane 4. In the sixth exemplary embodiment, the peripheral body 19 does not have a planar section but begins to extend towards the first plane 4 at the point at which it meets the periphery of the dome body 2. The peripheral body 19 has a partial toroidal surface as it extends towards the first plane 4.

Figure 7:
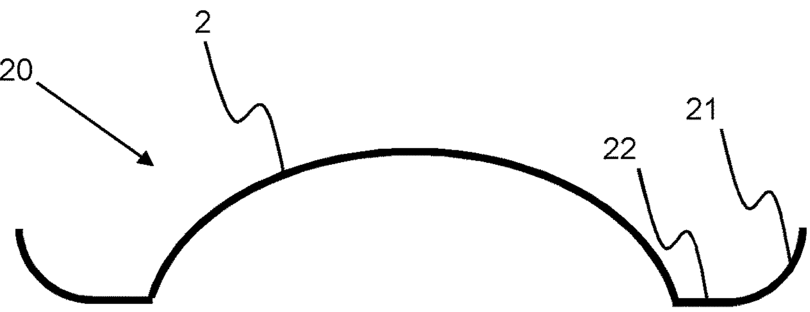
FIG. 7 illustrates schematically a side elevation cross-section view of a seventh exemplary non-planar body.

FIG. 7 is a schematic side elevation view of a seventh exemplary non-planar body 20. The non-planar body 20 has a dome body 2, which has an apex 3 that is located on a first plane 4. A peripheral body 21 is located on a second plane 6 at the point where it meets the periphery of the dome body 2. The peripheral body 21 extends toward the first plane 4. A planar section 22 of the peripheral body 11 forms an annulus around the periphery of the dome body 2 before the peripheral body 21 starts to extend towards the first plane 4. In the example of FIG. 7, the peripheral body 21 comprises a partial toroidal surface that extends towards the first plane 4. This toroidal surface differs from the partial toroidal surface 5 of the third exemplary non-planar body 1 in that it is radially centred in a side elevation view on a point above the second plane 6 in relation to the first plane 4. In contrast, in the third exemplary embodiment the partial toroidal surface is radially centred in a side elevation view on a point on or below the second plane 6 in relation to the first plane 4.

Figure 8:
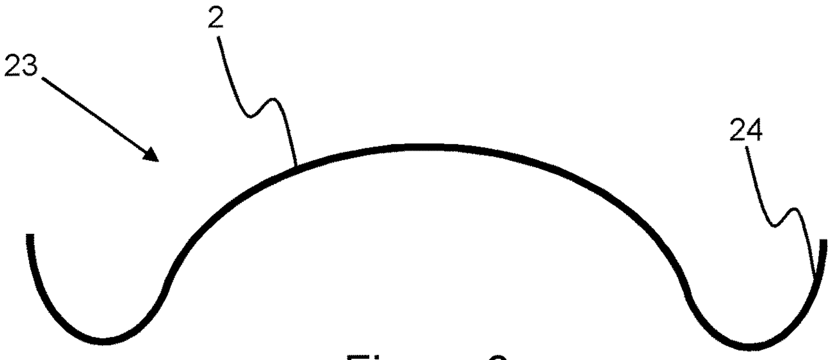
FIG. 8 illustrates schematically a side elevation cross-section view of an eighth exemplary non-planar body.

FIG. 8 is a schematic side elevation view of an eighth exemplary non-planar body 23. The non-planar body 23 has a dome body 2, which has an apex 3 that is located on a first plane 4. A peripheral body 24 is located on a second plane 6 at the point where it meets the periphery of the dome body 2. The periphery of the dome body 2 in the example of FIG. 8 is considered to be the inflexion point where the curvature of the dome body changes to the curvature of the peripheral body 24. The peripheral body 24 extends toward the first plane 4. In the example of FIG. 8, the peripheral body 24 comprises a partial toroidal surface that extends towards the first plane 4 in the same way as the peripheral body 21 shown in FIG. 7.

Figure 9:
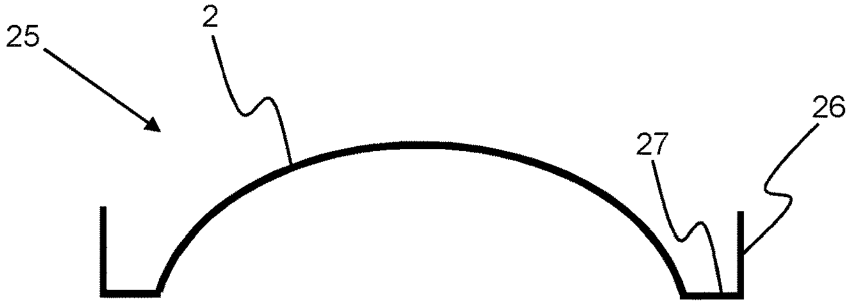
FIG. 9 illustrates schematically a side elevation cross-section view of a ninth exemplary non-planar body.

FIG. 9 is a schematic side elevation view of a ninth exemplary non-planar body 25. The non-planar body 25 has a dome body 2, which has an apex 3 that is located on a first plane 4. A peripheral body 26 is located on a second plane 6 at the point where it meets the periphery of the dome body 2. The peripheral body 26 extends toward the first plane 4 (although note that it does not extend towards the apex 3). Note that a planar section 27 of the peripheral body 5 forms an annulus around the periphery of the dome body 2 before the peripheral body 26 starts to extend towards the first plane 4. In the ninth exemplary embodiment, the portion of the peripheral body 26 that extends towards the first plane is substantially cylindrical, although it may deviate from a true cylindrical shape by a small angle in order to aid release from the substrate and improve deposition during the growth process.

Figure 10:
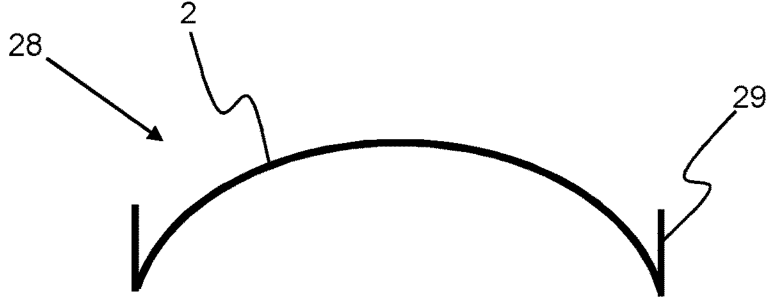
FIG. 10 illustrates schematically a side elevation cross-section view of a tenth exemplary non-planar body.

FIG. 10 is a schematic side elevation view of a tenth exemplary non-planar body 28. As with the embodiment of FIG. 3, the non-planar body 28 has a dome body 2, which has an apex 2 that is located on a first plane 4. A peripheral body 29 is located on a second plane 6 at the point where it meets the periphery of the dome body 2. The peripheral body 29 extends toward the first plane 4. In the tenth exemplary embodiment, the peripheral body 29 does not have a planar section but begins to extend towards the first plane 4 at the point at which it meets the periphery of the dome body 2. The peripheral body 29 is substantially cylindrical, although it may deviate from a true cylindrical shape by a small angle in order to aid release from the substrate and improve deposition during the growth process.

Figure 11:
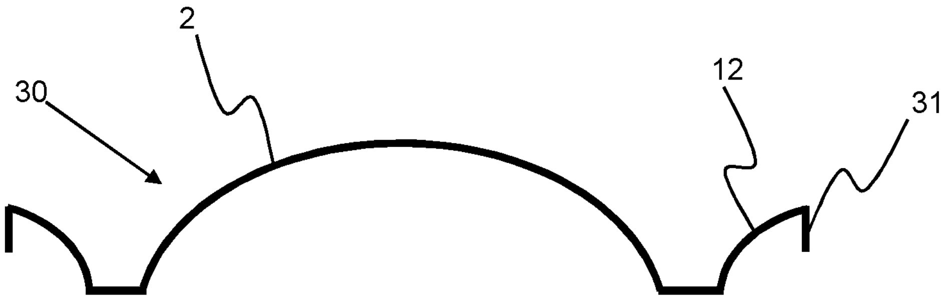
FIG. 11 illustrates schematically a side elevation cross-section view of an eleventh exemplary non-planar body.

FIG. 11 is a schematic side elevation view of an eleventh exemplary non-planar body 30. This non-planar body 30 has the same dome body 2 and peripheral body 12 as the third specific embodiment. There is also provided a secondary peripheral body 31 extending from the peripheral body 12. The secondary peripheral body 31 has a substantially cylindrical shape and extends towards or beyond the second plane 6.

A secondary peripheral body 31 extending towards the second plane 6 could also be provided on any of the fourth to eighth exemplary embodiments.

Figure 12:
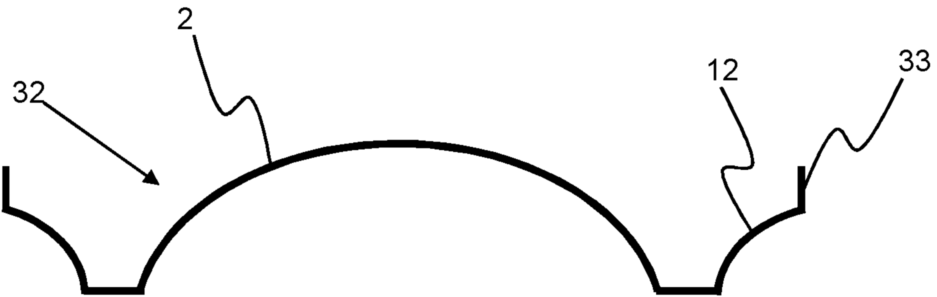
FIG. 12 illustrates schematically a side elevation cross-section view of a twelfth exemplary non-planar body.

FIG. 12 is a schematic side elevation view of a twelfth exemplary non-planar body 32. This non-planar body 32 has the same dome body 2 and peripheral body 12 as the first example. There is also provided a secondary peripheral body 33 extending from the peripheral body 12. The secondary peripheral body 33 has a substantially cylindrical shape and extends away from the second plane 6.

A secondary peripheral body 33 extending towards the second plane 6 could also be provided on any of the second to sixth exemplary embodiments.

Figure 13:
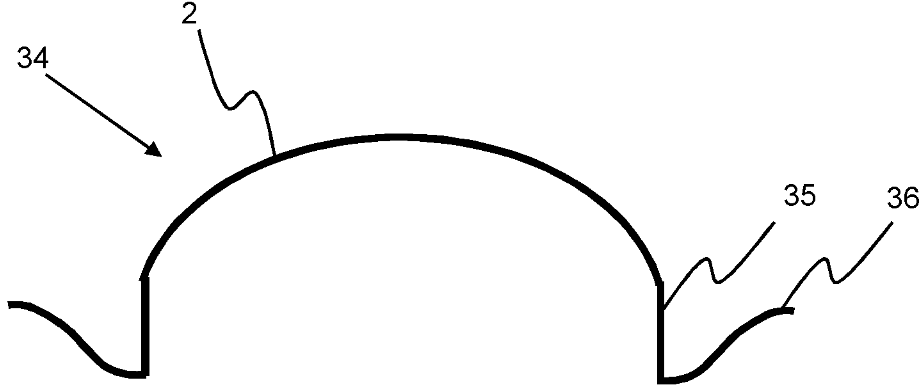
FIG. 13 illustrates schematically a side elevation cross-section view of a thirteenth exemplary non-planar body.

FIG. 13 is a schematic side elevation view of a thirteenth exemplary non-planar body 34. This non-planar body 34 has the same dome body 2 as the third exemplary embodiment. There is also provided a cylindrical body 25 extending from the outer perimeter of the dome body in a direction away from the first plane 4, and a peripheral body 26 extending outwards from the cylindrical body 35 in a direction towards the first plane 4.

Figure 14:
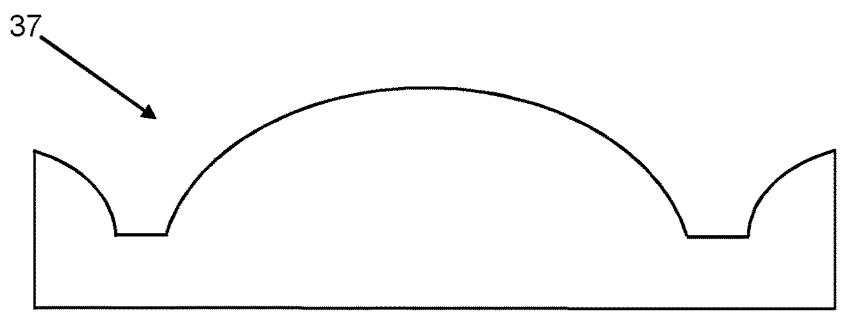
FIG. 14 illustrates schematically a side elevation cross-section view of a first exemplary substrate on which to grow a non-planar body.

A non-planar body body can be grown on a substrate that has the same shape as the non-planar body or an inverted substrate (depending on how the non-planar body 1 is viewed). FIG. 14 shows a first exemplary substrate 37 on which to deposit the non-planar body 1 of the third exemplary embodiment. In this example, the substrate takes the same shape as the non-planar body 1.

Figure 15:
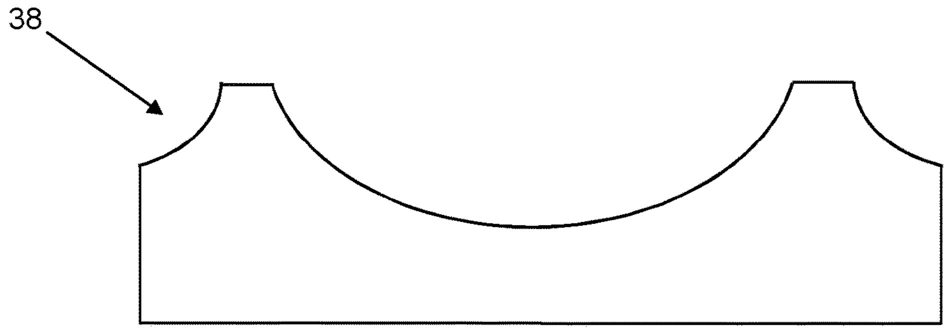
FIG. 15 illustrates schematically a side elevation cross-section view of a second exemplary substrate on which to grow a non-planar body.

FIG. 15 shows a second exemplary substrate 38 on which to deposit the non-planar body 1 of the third exemplary embodiment. In this example, the substrate is inverted with respect to the shape of the non-planar body 1.

It will be appreciated that similar substrates can be used for any of the exemplary embodiments shown in FIGS. 1 to 13. When selecting a substrate design, the skilled person considers factors such as how easily the non-planar body will release from the substrate and how evenly diamond will be deposited over the surface of the substrate.

The skilled person is also aware that the average grain size of the diamond at the nucleation face (i.e. where diamond growth starts on the substrate) is typically larger than the average grain size of the diamond at the opposite face. As this can affect the properties of the resultant non-planar body, the skilled person may consider this factor when selecting a substrate design.

The skilled person must also select a suitable substrate material. Materials such as carbide-forming refractory metals, silicon, graphite, polycrystalline diamond, silicon carbide and silicon carbide/diamond composites may be used. U.S. Pat. No. 5,556,464 describes forming speaker domes by chemical vapour deposition of synthetic diamond material on a convexly curved substrate to form a synthetic diamond film thereon followed by separation of the synthetic diamond film from the substrate to yield a diamond speaker dome. Synthetic diamond material is deposited on a convexly curved silicon substrate and separation of the synthetic diamond film from the substrate to yield the diamond speaker dome is achieved by dissolving the silicon substrate in acid.

An alternative approach is to use a refractory carbide-forming metal as the substrate, as described in WO 2013/178535. In this case, careful control of the surface roughness of a substrate is described. Polycrystalline CVD diamond is deposited onto the substrate and the mis-match of thermal expansion coefficients between the diamond and the substrate allows the controlled release of the diamond from the substrate on cooling. This type of process is also suitable for forming the non-planar bodies described herein, but it will be appreciated that complicated form-factors shapes may lead to keying of the diamond on the substrate and increase the risk of cracking on release of the diamond from the substrate.

A set of exemplary non-planar bodies were made with the geometry shown in FIG. 12 having a secondary peripheral body 33 extending towards the first plane 4. They were grown on prepared silicon substrates having a geometry as shown in FIG. 15. Each was manufactured in a microwave plasma CVD reactor using methane as a source of carbon. Non-planar bodies with a maximum film thicknesses of up to 100 μm were grown, with the overall mass varying between 40 mg and 140 mg. A low mass is a desirable property for an application such as a speaker dome because it allows responsive movement.

Figure 16:
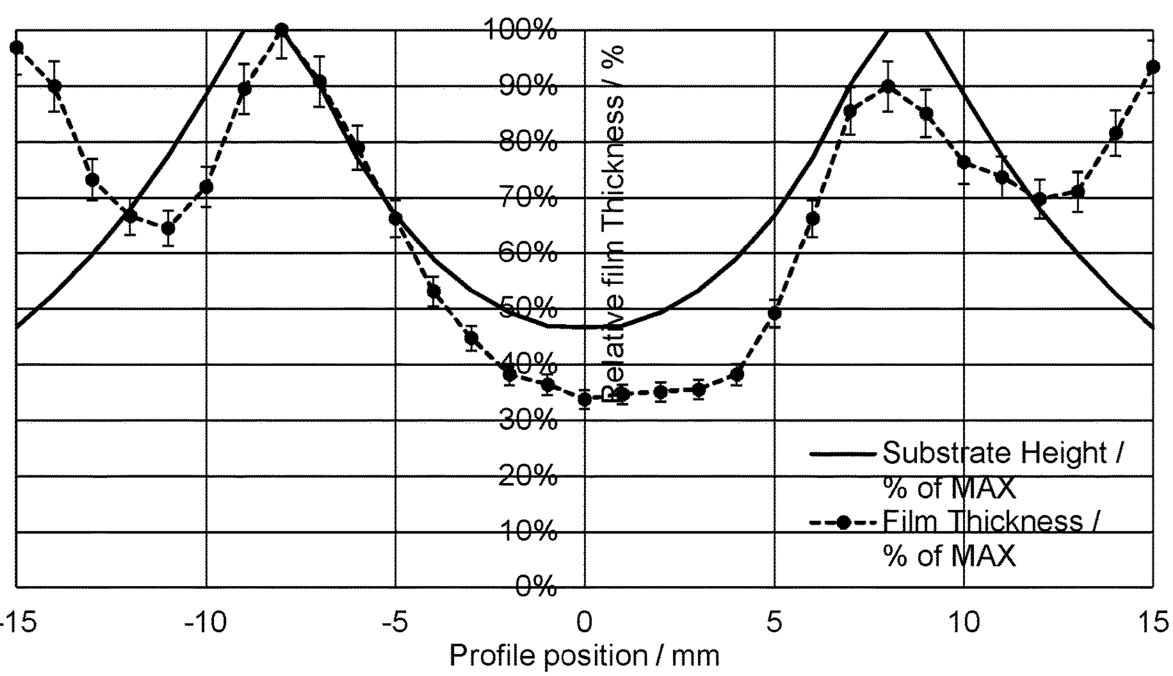
FIG. 16 is a graph of diamond thickness profile across a diamond non-planar body.

The shape of the substrate can affect the electrical field in the reactor and hence affect the plasma during diamond growth. Diamond can deposit at a higher rate in certain areas than other areas. FIG. 16 is a graph of average diamond thickness profile across a diamond non-planar body. The substrate height as a percentage of the maximum substrate height is shown as an unbroken black line, and the diamond thickness as a percentage of the maximum film thickness is shown as a dashed black line.

It can be seen that the maximum diamond thickness is found at the highest points of the substrate profile. The minimum thickness is at the apex of the non-planar body.

The diamond also became thicker towards the edges of the non-planar body. This distribution of thickness may be beneficial, as the non-planar body has the least mass at the apex of the dome body 2 and is strengthened by additional mass at the edge of the dome body 2. This is particularly beneficial in speaker dome applications, where the mass at the apex should be as low as possible to reduce inertia when the speaker dome moves, but the mass should be increased at the periphery of the dome body to strengthen the speaker dome.

The dome body typically has a mean thickness selected from any of no more than 500 μm, no more than 400 μm, no more than 300 μm, no more than 200 μm, no more than 100 μm, no more than 75 μm, and no more than 50 μm.

The thickness of the diamond in the non-planar body is such that the minimum thickness of the non-planar body is greater than 20% of the maximum thickness of the non-planar body, greater than 30% of the maximum thickness of the non-planar body, greater than 40% of the maximum thickness of the non-planar body, or greater than 50% of the maximum thickness of the non-planar body.

The non-planar body typically has a mass in a range selected from any of 35 mg to 150 mg, 60 mg to 120 mg, 65 mg to 110 mg, 70 mg to 105 mg, or 70 mg to 100 mg.

In order to investigate the effect of the peripheral body 5 extending towards the first plane 4, finite element analysis (FEA) was carried out for three different geometries of speaker dome:

A: a speaker dome with the geometry of FIG. 12 and formed with a dome body 2 and a peripheral body formed integrally of polycrystalline CVD diamond.

B: a speaker dome having no peripheral body; and

C: a speaker dome having a peripheral body extending away from the first plane 4, as described in WO2005/101900.

Figure 17:
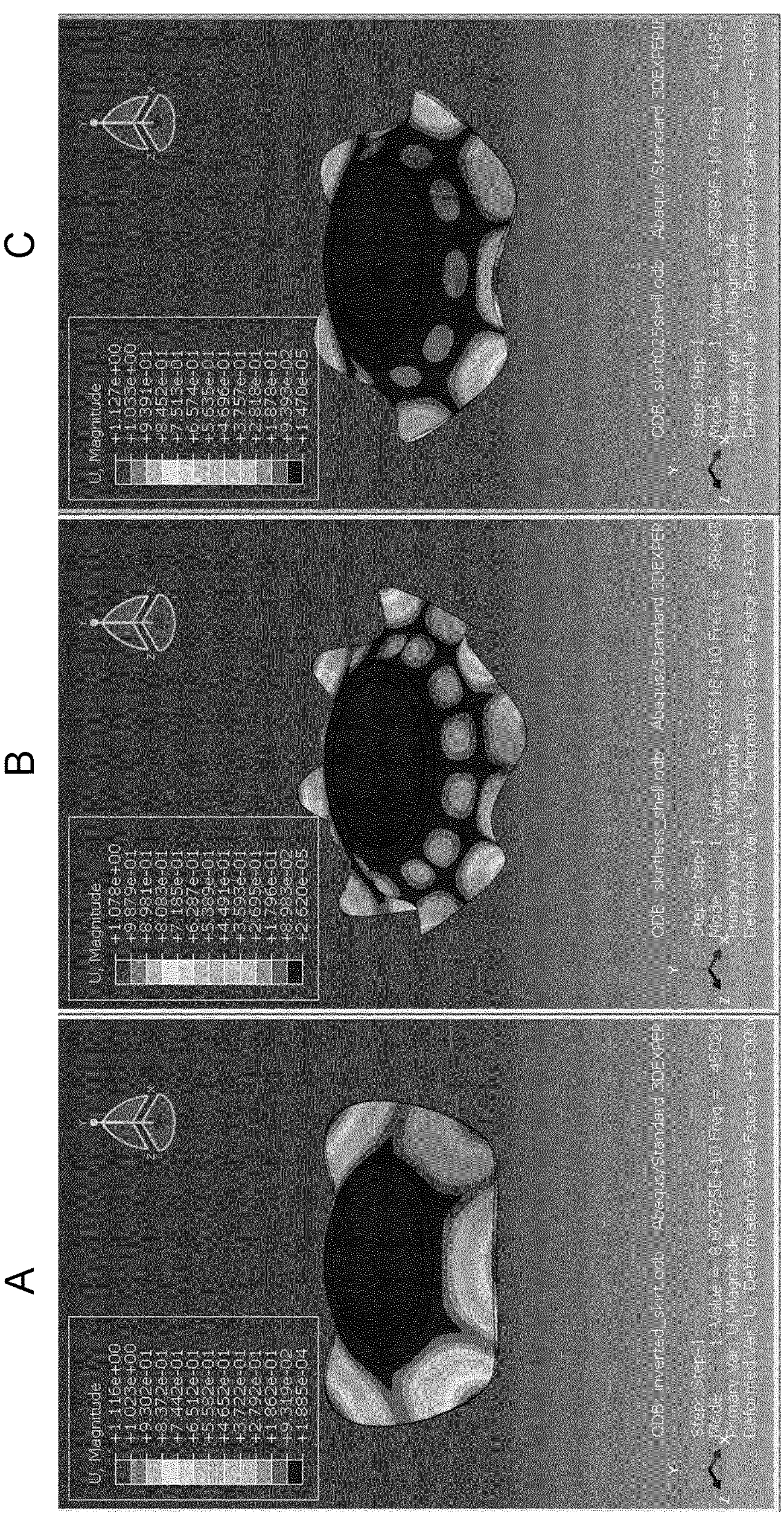
FIG. 17 shows break-up frequency modelling for three exemplary polycrystalline CVD diamond speaker domes.

FEA was carried out using Abaqus linear perturbation frequency analysis to identify eigenmodes or natural vibrations of structures. Example A gave a break-up frequency of 45.0 kHz, example B gave a break-up frequency of 38.8 kHz and example C have a break-up frequency of 41.7 kHz. It can be seen from FIG. 17 that example A also had a different break-up mode. The improvement in the break-up frequency may arise from the peripheral body constraining the vibrations.

The examples above describe a non-planar body formed entirely from polycrystalline diamond. However, it is possible for only the dome body 2 or the peripheral body 5 to be formed of polycrystalline diamond, and for the other part to be formed from a different material. The dome body 2 should be formed from a material that has high stiffness with a Young's modulus greater than 50 GPa, preferably greater than 100 GPa, 200 GPa, 300 GPa, 500 GPa, or 1000 GPa. The dome body 2 should also preferably be made of a material that is also of a low density. As described above, polycrystalline diamond is suitable for use as the dome body 2 material. Typical values of Young's modulus and density for polycrystalline diamond and other materials with a high Young's modulus are shown in Table 1 below. It can be seen that polycrystalline diamond has a significantly higher Young's modulus and comparable density to the other materials and is therefore provides a stiffer speaker dome with a higher break-up frequency than speaker domes made from other materials.

TABLE 1

| Selected properties of materials: | | |
|---|---|---|
| Material | Young's Modulus GPa | Density g/cm$^3$ |
| Mg | 45 | 1.74 |
| Al | 70 | 2.70 |
| Au | 79 | 19.3 |
| Be | 287 | 1.85 |
| Sapphire | 345 | 3.98 |
| Polycrystalline diamond | 1143 | 3.51 |

In order to provide another material that has a high Young's modulus, either the dome body 2 or the peripheral body 10 could be formed from the materials of Table 1 or from a densified or partially densified metal or metal alloy composite embedded with ultra-hard particles or grit. In this case, the ultra-hard particles or grit may be diamond or cubic boron nitride. The dome body 2 may be manufactured from polycrystalline diamond, and the peripheral body 10 may be manufactured from another material as described above. Alternatively, the dome body 2 may be manufactured from another material described above, and the peripheral body 10 may be manufactured from polycrystalline diamond material. The peripheral body 10 and the dome body 2 may be joined together using any suitable technique, such as use of an adhesive.

Note also that it may be advantageous to provide a coating on the non-planar body, such as those described in WO 2012/110357.

Figure 18:
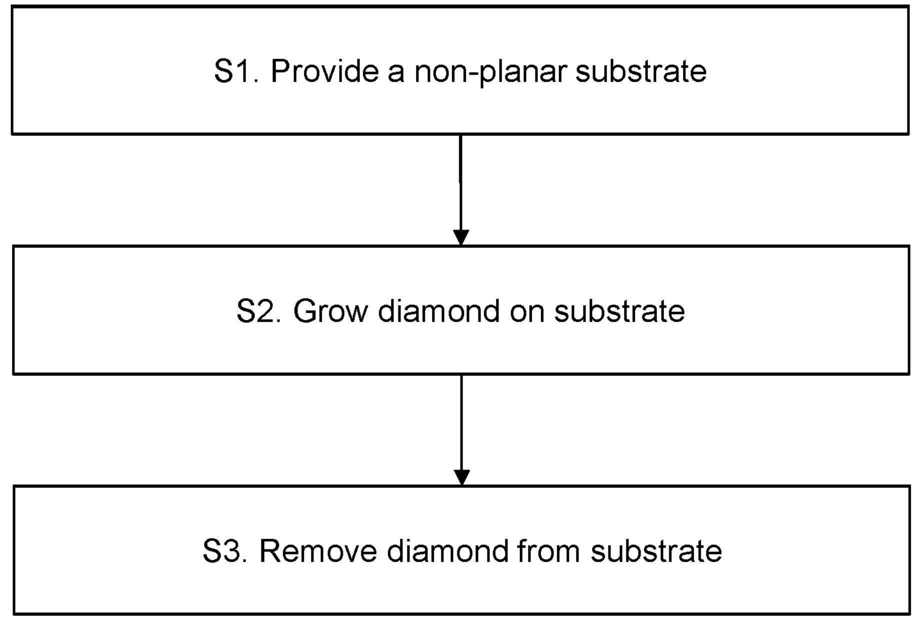
FIG. 18 is a flow diagram showing exemplary steps for manufacturing a non-planar body.

Turning now to FIG. 18, there is shown a flow chart showing exemplary steps in making a non-planar body. The following numbering corresponds to that shown in FIG. 18:

S1. A non-planar substrate is provided. Any suitable substrate may be used. For example, it is known to grow diamond on a silicon substrate, on a graphite substrate, on a silicon carbide body, or on a carbide forming refractory metal substrate, such as tungsten, molybdenum, niobium, tantalum, titanium and alloys thereof. Note that the non-planar substrate may be used to form a substrate for the entire non-planar body, in which the dome body and the peripheral body are integrally formed, or may be used to form only one of the dome body or the peripheral body. Where the dome body is formed on the substrate, the substrate may include a convex or a concave dome body on which to grow diamond.

S2. The substrate is placed in a reactor and diamond is grown on the substrate. Suitable reactors include a microwave plasma CVD reactor, a hot filament reactor, and a DC arc jet reactor.

S3. Once diamond has been grown to a suitable thickness, the diamond is removed from the substrate. Where the substrate is formed from silicon, the step of removing the film of polycrystalline diamond from the substrate may include dissolving the silicon in acid. Where the substrate is formed from graphite, the step of removing the film of polycrystalline diamond from the substrate may include processing the graphite away from the polycrystalline diamond. Where the substrate is formed from a carbide forming refractory metal substrate, the step of removing the film of polycrystalline diamond from the substrate may include cooling the carbide forming refractory metal substrate and the film of polycrystalline CVD synthetic diamond material at a controlled rate whereby the film of polycrystalline CVD synthetic diamond material delaminates from a metal carbide surface of the carbide forming refractory metal substrate during cooling.

Where the polycrystalline diamond does not form the entire non-planar body, the method also comprises affixing another part to the polycrystalline diamond to form the non-planar body. For example, when the dome body is grown in the reactor, the method further includes affixing the peripheral body to the dome body to form the non-planar body. Where the peripheral body is grown in the reactor, the method further comprising affixing the dome body to the peripheral body to form the non-planar body.

While this invention has been particularly shown and described with reference to preferred embodiments, it will be understood to those skilled in the art that various changes in form and detail may be made without departing from the scope of the invention as defined by the appendant claims. For example, the exemplary embodiments described above are manufactured using a microwave plasma CVD reactor, but the skilled person will appreciate that non-planar body can be manufactured using a variety of techniques, including hot filament and DC arc jet reactors.

The invention claimed is:

1. A non-planar body comprising:

a dome body having an apex and an outer periphery, the apex located on a first plane and the outer periphery located on a second plane substantially parallel to the first plane;

a peripheral body extending at least partially around the outer periphery of the dome body, wherein the peripheral body extends at an angle of less than 180° when measured at an outer surface of the dome body and with respect to a tangent relative to the dome body at the outer periphery of the dome body, and wherein the peripheral body extends towards the first plane such that a distal end of the peripheral body is located away from the second plane;

wherein the peripheral body only contacts the second plane once;

wherein the dome body and the peripheral body are integrally formed from polycrystalline diamond; and wherein the non-planar body is circular in plan view, and a ratio of a distance between the first plane and the second plane to a diameter of the non-planar body is between 0.05 and 0.30.

2. The non-planar body according to claim 1, wherein the dome body comprises a partial ellipsoidal surface.

3. The non-planar body according to claim 1, wherein the dome body comprises a partial spherical surface.

4. The non-planar body according to claim 1, wherein the peripheral body extends fully around the outer periphery of the dome body.

5. The non-planar body according to claim 1, wherein the peripheral body comprises any of a partial toroidal surface, a frustoconical surface or a substantially cylindrical surface.

6. The non-planar body according to claim 1, having a largest linear dimension when projected onto a plane selected from any of no less than 10 mm, no less than 20 mm, or no less than 30 mm.

7. The non-planar body according to claim 1, wherein the dome body has a mean thickness selected from any of no more than 500 μm, no more than 400 μm, no more than 300 μm, no more than 200 μm, no more than 100 μm, no more than 75 μm, no more than 50 μm, or no more than 25 μm.

8. The non-planar body according to claim 1, wherein the minimum thickness of the diamond in the non-planar body is greater than 20% of the maximum thickness of the non-planar body, greater than 30% of the maximum thickness of the non-planar body, greater than 40% of the maximum thickness of the non-planar body, or greater than 50% of the maximum thickness of the non-planar body.

9. The non-planar body according to claim 1, further comprising a secondary peripheral body extending from an outer periphery of the peripheral body.

10. The non-planar body according to claim 1, wherein the ratio of the distance between the first plane and the second plane to the diameter of the non-planar body is between 0.08 and 0.2 or 0.10 and 0.15.

11. The non-planar body according to claim 1, wherein an average thickness at the apex of the dome body is greater than an average thickness at the outer periphery of the dome body.

12. A speaker dome comprising the non-planar body according to claim 1.

13. A method of fabricating the non-planar body according to claim 1, the method comprising:

providing a non-planar substrate;

in a reactor, growing a film of polycrystalline diamond on the non-planar substrate;

removing the film of polycrystalline diamond from the substrate to form the non-planar body.

14. The method according to claim 13, wherein the substrate is formed of silicon, and the step of removing the film of polycrystalline diamond from the substrate comprises dissolving the silicon in acid.

15. The method according to claim 13, wherein the substrate is formed from graphite and the step of removing the film of polycrystalline diamond from the substrate comprises processing the graphite away from the polycrystalline diamond.

16. The method according to claim 13, wherein the substrate is formed from a carbide forming refractory metal substrate and the step of removing the film of polycrystalline diamond from the substrate comprises cooling the carbide forming refractory metal substrate and the film of polycrystalline diamond at a controlled rate whereby the film of polycrystalline diamond delaminates from a metal carbide surface of the carbide forming refractory metal substrate during cooling.

* * * * *